United States Patent
Sakane

(10) Patent No.: US 9,200,133 B2
(45) Date of Patent: Dec. 1, 2015

(54) CURABLE EPOXY RESIN COMPOSITION

(75) Inventor: Masanori Sakane, Ohtake (JP)

(73) Assignee: DAICEL CORPORATION, Osaka-Shi (JP)

(*) Notice: Subject to any disclaimer, the term of this patent is extended or adjusted under 35 U.S.C. 154(b) by 0 days.

(21) Appl. No.: 13/883,297

(22) PCT Filed: Nov. 9, 2011

(86) PCT No.: PCT/JP2011/075816
§ 371 (c)(1),
(2), (4) Date: May 3, 2013

(87) PCT Pub. No.: WO2012/073666
PCT Pub. Date: Jun. 7, 2012

(65) Prior Publication Data
US 2013/0241086 A1    Sep. 19, 2013

(30) Foreign Application Priority Data
Nov. 30, 2010    (JP) ................. 2010-267355

(51) Int. Cl.
| | |
|---|---|
| C08L 63/00 | (2006.01) |
| C08G 59/24 | (2006.01) |
| H01L 23/29 | (2006.01) |
| H01L 23/31 | (2006.01) |
| C08K 3/36 | (2006.01) |
| C08K 5/52 | (2006.01) |

(52) U.S. Cl.
CPC . *C08K 3/36* (2013.01); *C08G 59/24* (2013.01); *C08K 5/52* (2013.01); *C08L 63/00* (2013.01); *H01L 23/29* (2013.01); *H01L 23/293* (2013.01)

(58) Field of Classification Search
USPC ........................................ 523/451
See application file for complete search history.

(56) References Cited

U.S. PATENT DOCUMENTS

| | | | |
|---|---|---|---|
| 5,756,780 A | 5/1998 | Ohyama et al. | |
| 2004/0067366 A1 | 4/2004 | Gorczyca | |
| 2005/0261397 A1* | 11/2005 | Ito | 523/400 |
| 2006/0100301 A1* | 5/2006 | You et al. | 522/71 |
| 2007/0128376 A1* | 6/2007 | Harada et al. | 428/1.1 |
| 2010/0120965 A1* | 5/2010 | Kikuchi et al. | 524/444 |
| 2010/0171146 A1* | 7/2010 | Takeuchi et al. | 257/100 |
| 2010/0304284 A1 | 12/2010 | Rinker | |
| 2013/0131216 A1* | 5/2013 | Sakane | 523/451 |

FOREIGN PATENT DOCUMENTS

| | | |
|---|---|---|
| CN | 1534074 A | 10/2004 |
| CN | 101050295 A | 10/2007 |
| JP | 61-26619 A | 2/1986 |
| JP | 9-67356 A | 3/1997 |
| JP | 11-92549 A | 4/1999 |
| JP | 2002-363255 A | 12/2002 |
| JP | 2004-339263 A | 12/2004 |
| JP | 2008-038017 A | 2/2008 |
| JP | 2010-507696 A | 3/2010 |

OTHER PUBLICATIONS

International Search Report, mailed Feb. 14, 2012, issued in PCT/JP2011/075816.

* cited by examiner

*Primary Examiner* — Randy Gulakowski
*Assistant Examiner* — Christopher M Rodd
(74) *Attorney, Agent, or Firm* — Birch, Stewart, Kolasch & Birch, LLP

(57) ABSTRACT

Disclosed is a liquid curable epoxy resin composition which includes a cycloaliphatic epoxy compound (A) having at least one alicyclic skeleton and two or more epoxy groups per molecule; a silica (B); and a phosphite ester (C). The liquid curable epoxy resin composition preferably includes, for example, 5 to 80 parts by weight of the cycloaliphatic epoxy compound (A) having at least one alicyclic skeleton and two or more epoxy groups per molecule; 20 to 95 parts by weight of the silica (B); and 0.001 to 5.0 parts by weight of the phosphite ester (C), per 100 parts by weight of the total amount of the components (A) and (B).

14 Claims, No Drawings

CURABLE EPOXY RESIN COMPOSITION

TECHNICAL FIELD

The present invention relates to an epoxy resin composition. More specifically, the present invention relates to a liquid curable epoxy resin composition which has a low viscosity and can be stored satisfactorily stably. The composition can give a cured product through thermal curing with an acid anhydride, cationic curing, or photo-induced cationic curing.

BACKGROUND ART

Liquid encapsulants or molding compounds for semiconductor use require various properties as follows. Specifically, they should have a low viscosity for good coating workability. They should have a low coefficient of thermal expansion and undergo less warpage so as to have a coefficient of thermal expansion similar to that of the substrate to thereby prevent interfacial peeling (interfacial delamination) upon the application of thermal stress. They should contain small amounts of ionic impurities so as to avoid corrosion on IC chips. In addition, they should be stored satisfactorily stably (should have good storage stability (long shelf life)). As such liquid encapsulants for semiconductor use, there has been used a composition including a cycloaliphatic epoxy compound and a silica. The cycloaliphatic epoxy compound has a low viscosity and contains substantially no chlorine component because of using no epichlorohydrin as a starting material. The silica helps the composition to have a lower coefficient of thermal expansion.

The cycloaliphatic epoxy compound has good cationic curability. However, when the cycloaliphatic epoxy compound is used as a composition with a silica, the composition disadvantageously has poor storage stability because the cycloaliphatic epoxy compound, as having good cationic curability, undergoes a reaction with silanol groups in the silica. Specifically, the composition including the cycloaliphatic epoxy compound and the silica disadvantageously has poor storage stability, in which the composition is liable to have an increasing viscosity with time (namely, has poor viscosity stability).

As a possible solution to solve the poor storage stability, a technique of using a metal chelate catalyst in a composition has been proposed (see Patent Literature (PTL) 1). This technique, however, employs a metal, and the metal may probably adversely affect electric properties of a cured product obtained from the composition.

CITATION LIST

Patent Literature

PTL 1: Japanese Unexamined Patent Application Publication (JP-A) No. H11-92549

SUMMARY OF INVENTION

Technical Problem

Accordingly, an object of the present invention is to provide a liquid curable epoxy resin composition as a silica-containing epoxy resin composition, which has a low viscosity and can be stored satisfactorily stably.

Solution to Problem

The present inventors have found that the poor storage stability can be remedied by adding a phosphite ester to a composition including a cycloaliphatic epoxy compound and a silica. The present invention has been made based on these findings.

Specifically, the present invention provides a liquid curable epoxy resin composition including a cycloaliphatic epoxy compound (A); a silica (B); and a phosphite ester (C), in which the cycloaliphatic epoxy compound (A) has at least one alicyclic skeleton and two or more epoxy groups per molecule.

The liquid curable epoxy resin composition may include 5 to 80 parts by weight of the cycloaliphatic epoxy compound (A) having at least one alicyclic skeleton and two or more epoxy groups per molecule; 20 to 95 parts by weight of the silica (B); and 0.001 to 5.0 parts by weight of the phosphite ester (C), per 100 parts by weight of the components (A) and (B).

The liquid curable epoxy resin composition may further include a curing catalyst (F), or a combination of a curing agent (D) with a curing accelerator (E).

The liquid curable epoxy resin composition may be used for semiconductor encapsulation.

The present invention further provides a resin cured product cured from the liquid curable epoxy resin composition.

In addition and advantageously, the present invention provides a semiconductor device which includes a semiconductor element encapsulated with the liquid curable epoxy resin composition for semiconductor encapsulation.

Advantageous Effects of Invention

The liquid curable epoxy resin composition according to the present invention has the configuration, thereby has a low viscosity, and can be stored satisfactorily stably (has a long shelf life). Specifically, the liquid curable epoxy resin composition according to the present invention is resistant to viscosity increase with time and is highly stable in viscosity. The liquid curable epoxy resin composition according to the present invention is a silica-containing composition and, when cured, gives a resin cured product which has advantageous properties such as low coefficient of thermal expansion and is preferably usable as a resin composition for semiconductor encapsulation.

DESCRIPTION OF EMBODIMENTS

For satisfactory workability upon semiconductor encapsulation, a liquid curable epoxy resin composition according to an embodiment the present invention is liquid and has a viscosity (25° C.) of preferably 150,000 mPa·s or less and more preferably 100,000 mPa·s or less. As used herein the term "liquid" refers to being liquid at room temperature (25° C.)

The liquid curable epoxy resin composition according to the present invention includes a cycloaliphatic epoxy compound (A); a silica (B); and a phosphite ester (C). Specifically, the liquid curable epoxy resin composition according to the present invention is a liquid curable epoxy resin composition including at least a cycloaliphatic epoxy compound (A); a silica (B); and a phosphite ester (C). The components (A), (B), and (C) for use in the present invention will be illustrated below.

[Cycloaliphatic Epoxy Compound (A)]

The cycloaliphatic epoxy compound (A) for use in the liquid curable epoxy resin composition according to the present invention is not limited as long as being a compound having at least one alicyclic skeleton and two or more epoxy groups per molecule, but is preferably one in which the epoxy groups each include adjacent two carbon atoms constituting an alicyclic skeleton. Examples of such cycloaliphatic epoxy compounds (A) include compounds expressed as follows:

[Chem. 1]

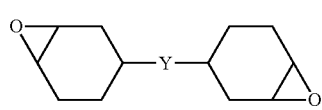
(I)

Of the cycloaliphatic epoxy compounds represented by General Formula (I), preferred are those prepared by oxidizing a corresponding alicyclic olefin compound typically with an aliphatic peroxycarboxylic acid, which aliphatic peroxycarboxylic acid is substantially anhydrous (e.g., JP-A No. 2002-275169). This is because the resulting cycloaliphatic epoxy compounds have high degrees of epoxidation.

In General Formula (I), Y represents a single bond or a linkage group. The linkage group is exemplified by divalent hydrocarbon groups, carbonyl group (—CO—), ether bond (—O—), ester bond (—COO—), amide bond (—CONH—), carbonate bond (—OCOO—), and groups each including two or more of these linked to each other. The divalent hydrocarbon groups are preferably exemplified by straight or branched chain alkylene groups having 1 to 18 carbon atoms (of which those having 1 to 6 carbon atoms are more preferred); and divalent alicyclic hydrocarbon groups (of which divalent cycloalkylene groups are more preferred). The straight or branched chain alkylene groups are typified by methylene, methylmethylene, dimethylmethylene, ethylene, propylene, and trimethylene groups. The divalent alicyclic hydrocarbon groups are typified by 1,2-cyclopentylene, 1,3-cyclopentylene, cyclopentylidene, 1,2-cyclohexylene, 1,3-cyclohexylene, 1,4-cyclohexylene, and cyclohexylidene groups.

The compounds are specifically exemplified by compounds as follows.

[Chem. 2]

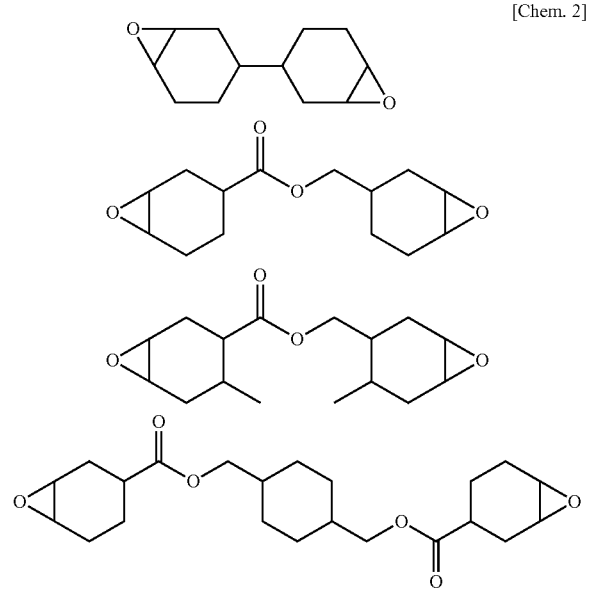

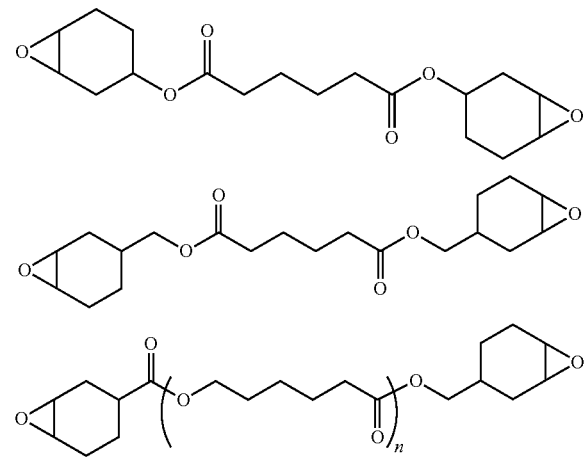

The number n denotes an integer of 1 to 30.

Exemplary cycloaliphatic epoxy compounds usable herein as the component (A) further include, in addition to the above compounds, limonene diepoxide and other cycloaliphatic epoxy compounds in which only one of two epoxy groups includes adjacent two carbon atoms constituting an alicyclic skeleton; and glycidyl ether compounds in which epoxy groups do not include carbon atom constituting an alicyclic skeleton (e.g., glycidyl ether epoxy compounds each having at least one alicyclic skeleton and glycidyl ether groups). These compounds are specifically exemplified by compounds as follows.

[Chem. 3]

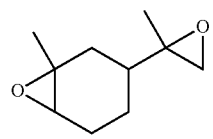

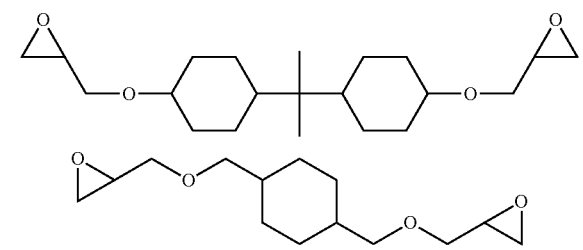

Exemplary cycloaliphatic epoxy compounds usable herein as the component (A) further include multifunctional epoxy compounds having three or more epoxy groups, which are exemplified by compounds as follows.

[Chem. 4]

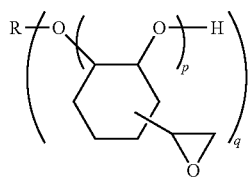

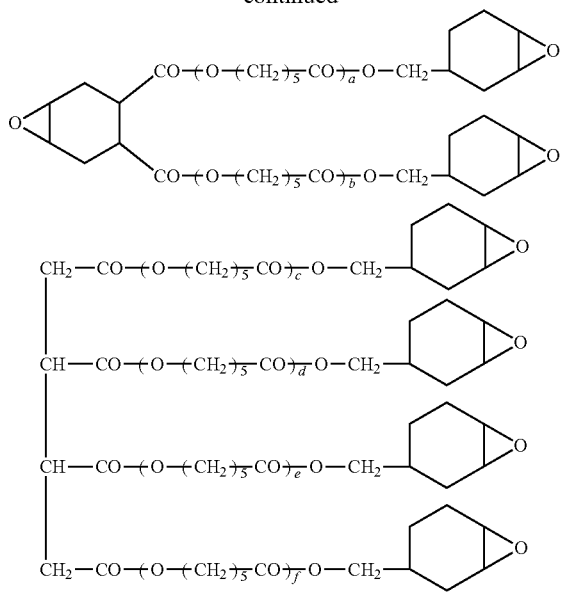

In the formulae, a, b, c, d, e, and f are each independently an integer of 0 to 30. In the formula, R represents a group corresponding to a q-hydric alcohol [R—(OH)$_q$], except for removing OH in a number of q therefrom; p denotes an integer of 1 to 50; and q denotes an integer of 1 to 10. The repetition numbers p in the groups in parentheses in a number of q may be the same as or different from each other. The q-hydric alcohol [R—(OH)$_q$] is exemplified by monohydric alcohols such as methanol, ethanol, 1-propanol, isopropyl alcohol, and 1-butanol; dihydric alcohols such as ethylene glycol, 1,2-propanediol, 1,3-propanediol, 1,4-butanediol, neopentyl glycol, 1,6-hexanediol, diethylene glycol, triethylene glycol, tetraethylene glycol, dipropylene glycol, and polypropylene glycols; and trihydric or higher alcohols such as glycerol, diglycerol, erythritol, trimethylolethane, trimethylolpropane, pentaerythritol, dipentaerythritol, and sorbitol. The alcohol may also be any of polyether polyols, polyester polyols, polycarbonate polyols, and polyolefin polyols. Among them, the alcohol is preferably any of aliphatic alcohols having 1 to 10 carbon atoms (of which trimethylolpropane and other aliphatic polyhydric alcohols are preferred).

Each of different cycloaliphatic epoxy compounds (A) having at least one alicyclic skeleton and two or more epoxy groups per molecule may be used alone or in combination.

The epoxy resin composition may contain cycloaliphatic epoxy compound(s) as the component (A) in an amount not critical, but preferably 5 to 80 parts by weight, more preferably 10 to 75 parts by weight, and furthermore preferably 20 to 65 parts by weight, per 100 parts by weight of the total amount of the component (A) and the after-mentioned component (B). The epoxy resin composition, if containing cycloaliphatic epoxy compound(s) in an amount of more than 80 parts by weight, may fail to enjoy the effects of the component (B) as added. In contrast, the epoxy resin composition, if containing cycloaliphatic epoxy compound(s) in an amount of less than 5 parts by weight, may give a cured product which is too fragile to be used.

Of cycloaliphatic epoxy compounds for use as the component (A), a low-viscosity compound can play a role also as a reactive diluent when used in combination with another component (A). The low-viscosity compound is exemplified by low-viscosity cycloalkylene glycol diglycidyl ethers having a viscosity of 500 mPa·s or less at 25° C. Such cycloalkylene glycol diglycidyl ethers are exemplified by cyclohexanedimethanol diglycidyl ether, cyclohexanediol diglycidyl ether, and hydrogenated bisphenol-A epoxy resins Other reactive diluents than components (A) are also usable. Such reactive diluents are exemplified by liquid glycidyl epoxy resins having an aromatic ring, such as bisphenol-A and bisphenol-F glycidyl epoxy resins; and liquid glycidylamine epoxy resins. The epoxy resin composition may contain a reactive diluent other than components (A), when employing, in an amount of preferably 20 parts by weight or less and more preferably 15 parts by weight or less, per 100 parts by weight of cycloaliphatic epoxy compound(s) as the component (A). The epoxy resin composition, if containing the reactive diluent(s) in an amount of more than 20 parts by weight, may be difficult to have desired performance.

Such a cycloaliphatic epoxy compound for use as the component (A) in the present invention is preferably liquid for better workability upon preparation and cast molding. However, even an epoxy compound that is solid when present alone is usable, as long as giving, by blending respective components, a liquid curable epoxy resin composition having a viscosity of 150,000 mPa·s or less at 25° C. This is also true for other epoxy compounds than the component (A). Exemplary usable solid epoxy compounds include bisphenol epoxy compounds, novolak epoxy compounds, glycidyl esters, triglycidyl isocyanurate, and a product available under the trade name "EHPE-3150" (epoxidized cyclohexane polyether, from Daicel Chemical Industries Ltd.), each of which is solid. Each of different solid epoxy compounds may be used alone or in combination, together with other components. The liquid curable epoxy resin composition may contain a solid epoxy compound in such an amount that the liquid curable epoxy resin composition have a viscosity of typically 150,000 mPa·s or less at 25° C.

[Silica (B)]

The silica (B) for use in the liquid curable epoxy resin composition according to the present invention is not limited and may be a known or customary silica, which is specifically exemplified by fused silica, crystalline silica, and high-purity synthetic silica. Among them, fused silica and high-purity synthetic silica are preferred as the silica (B) so as to allow the epoxy resin composition to have satisfactory viscosity stability and to give a resin cured product having a coefficient of thermal expansion and electric properties at satisfactory levels. Each of different silicas (B) may be used alone or in combination.

The silica (B) may have any shape not critical, such as spheroid, crushed, fibrous, needle-like, flaky, or whisker shape. Among such shapes, the silica (B) preferably has a spheroid shape for satisfactory quality stability even when the silica (B) is used in a large proportion (at a high filling rate).

The silica (B) may have an average particle diameter not critical, but preferably 0.1 to 50 μm and more preferably 0.2 to 35 μm, for satisfactory quality stability even when the silica (B) is used in a large proportion. As used herein the term "average particle diameter" refers to a value of the particle diameter at 50% in a cumulative distribution as measured by a laser diffraction/scattering method. This diameter is also referred to as a "median diameter."

The silica (B) may also be available as commercial products typically under the trade name "FUSELEX RD-8" (from Tatsumori Ltd.); and the trade name "HPS-0500" (from Toagosei Co., Ltd.).

The epoxy resin composition may contain a silica as the component (B) in an amount not critical, but preferably 20 to 95 parts by weight, more preferably 25 to 90 parts by weight, and furthermore preferably 30 to 85 parts by weight, per 100 parts by weight of the total amount of the components (A) and (B). The epoxy resin composition, if containing silica(s) in an amount of more than 95 parts by weight, may give a cured product that is too fragile to be used. In contrast, the epoxy resin composition, if containing silica(s) in an amount of less than 20 parts by weight, may give a resin cured product having an excessively high coefficient of thermal expansion.

[Phosphite Ester (C)]

Next, the phosphite ester (phosphorous ester; phosphite ester compound) for use as the component (C) in the present invention will be illustrated.

Preferred examples of the phosphite ester (C) include 9,10-dihydro-9-oxa-10-phosphaphenanthrene-10-oxide, bis(2,6-di-t-butyl-4-methylphenyl)pentaerythritol diphosphite, bis (2,4-di-t-butylphenyl)pentaerythritol diphosphite, tris(2,4-di-t-butylphenyl)phosphite, tris(mono- or di-nonylphenyl) phosphite, tris(2-ethylhexyl)phosphite, triphenyl phosphite, tris(mononopylphenyl)phosphite, and trisisodecyl phosphite. Each of different phosphite esters (C) may be used alone or in combination.

Such phosphite esters (C) are also available as products under the trade names "JP-360" and "JP-308E" (each from Johoku Chemical Co., Ltd.); the trade name "IRGAFOS 168" (from Ciba Specialty Chemicals Corporation); the trade name "Sanko Epoclean" (from SANKO CO., LTD.); and the trade names "ADK STAB 3010" and "ADK STAB PEP-36" (each from ADEKA CORPORATION).

The epoxy resin composition may contain a phosphite ester or esters as the component (C) in an amount not critical, but preferably 0.001 to 5.0 parts by weight, more preferably 0.005 to 1.0 parts by weight, and furthermore preferably 0.01 to 0.5 part by weight, per 100 parts by weight of the total amount of the components (A) and (B). The liquid curable epoxy resin composition, if containing the phosphite ester(s) (C) in an amount of more than 5.0 parts by weight, may have insufficient resistance to hydrolysis. In contrast, the liquid curable epoxy resin composition, if containing the phosphite ester(s) (C) in an amount of less than 0.001 part by weight, may have insufficient viscosity stability and may thereby have inferior storage stability.

The liquid curable epoxy resin composition according to the present invention may further include one or more other components in addition to the base resin typically including the components (A), (B), and (C). Specifically, the liquid curable epoxy resin composition according to the present invention may further include, for example, a curing catalyst (F) or a combination of a curing agent (D) with a curing accelerator (E) in addition to the base resin.

[Curing Agent (D)]

The curing agent (D) reacts with the cycloaliphatic epoxy compound (A) to cure the epoxy resin composition. The curing agent (D) may be any of curing agents well-known or customarily used as epoxy-resin curing agents. Among them, acid anhydrides that are liquid at 25° C. are preferred as the curing agent (D). Such acid anhydrides are exemplified by methyltetrahydrophthalic anhydride, methylhexahydrophthalic anhydride, dodecenylsuccinic anhydride, and methyl-endomethylene-tetrahydrophthalic anhydride. Each of different curing agents (D) may be used alone or in combination. An acid anhydride being solid at room temperature (about 25° C.), when employed, is preferably used as a liquid mixture prepared by dissolving the same in an acid anhydride being liquid at room temperature (about 25° C.)

The acid anhydride being solid at room temperature is exemplified by phthalic anhydride, tetrahydrophthalic anhydride, hexahydrophthalic anhydride, and methylcyclohexenedicarboxylic anhydride.

Such acid anhydride, when used as the curing agent (D), helps the liquid curable epoxy resin composition according to the present invention to give a resin cured product through thermal curing with the acid anhydride.

The curing agent (D) for use herein is also available as commercial products typically under the trade name "RIKACID MH" (from New Japan Chemical Co., Ltd.); the trade name "RIKACID MH-700" (from New Japan Chemical Co., Ltd.); and the trade name "HN-5500" (from Hitachi Chemical Company, Ltd.).

Though not critical, the epoxy resin composition may include the curing agent(s) (D) in an amount of preferably 50 to 150 parts by weight, more preferably 52 to 145 parts by weight, and furthermore preferably 55 to 140 parts by weight, per 100 parts by weight of the component (A). More specifically, the epoxy resin composition preferably includes the curing agent(s) (D) in such an effective amount as to exhibit effects as a curing agent, namely, generally in an amount corresponding to 0.5 to 1.5 equivalents of acid anhydride per 1 equivalent of epoxy groups in the cycloaliphatic epoxy compound as the component (A) and other optional epoxy compounds.

[Curing Accelerator (E)]

The curing accelerator (E) for use herein is not limited, as long as being a curing accelerator generally used for the acceleration of curing of epoxy compounds, and is exemplified by tertiary amines, tertiary amine salts, imidazoles, organophosphorus compounds, quaternary ammonium salts, quaternary phosphonium salts, organometallic salts, and boron compounds. Each of different curing accelerators (E) may be used alone or in combination.

The tertiary amines are exemplified by lauryldimethylamine, N,N-dimethylcyclohexylamine, N,N-dimethylbenzylamine, N,N-dimethylaniline, (N,N-dimethylaminomethyl)phenol, 2,4,6-tris(N,N-dimethylaminomethyl)phenol, 1,8-diazabicyclo[5.4.0]undecene-7 (DBU), and 1,5-diazabicyclo[4.3.0]nonene-5 (DBN).

The tertiary amine salts are exemplified by carboxylic acid salts, sulfonic acid salts, and inorganic acid salts of the tertiary amines. The carboxylic acid salts are typified by octylic acid salts and other salts of carboxylic acids having 1 to 30 carbon atoms (preferably 1 to 10 carbon atoms), of which fatty acid salts are particularly preferred. The sulfonic acid salts are typified by p-toluenesulfonic acid salts, benzenesulfonic acid salts, methanesulfonic acid salts, and ethanesulfonic acid salts. Representative examples of such tertiary amine salts include salts (e.g., p-toluenesulfonic acid salt and octylic acid salt) of 1,8-diazabicyclo[5.4.0]undecene-7 (DBU).

The imidazoles are exemplified by 2-methylimidazole, 2-ethylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 2,4-diamino-6-(2-methylimidazolylethyl)-1,3,5-triazine, 2,4-diamino-6-(2-undecylimidazolylethyl)-1,3,5-triazine, 2,4-diamino-6-(2-ethyl-4-methylimidazolylethyl)-1,3,5-triazine, 2-phenyl-4,5-dihydroxymethylimidazole, and 2-phenyl-4-methyl-5-hydroxymethylimidazole.

The organophosphorus compounds are exemplified by triphenylphosphine.

The quaternary ammonium salts are exemplified by tetraethylammonium bromide and tetrabutylammonium bromide.

The quaternary phosphonium salts are exemplified by compounds represented by following General Formula (II):

[Chem. 5]

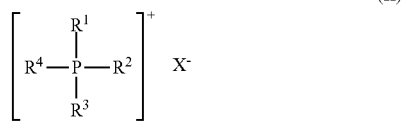

$$\left[ \begin{array}{c} R^1 \\ | \\ R^4-P-R^2 \\ | \\ R^3 \end{array} \right]^+ X^-$$
(II)

wherein $R^1$, $R^2$, $R^3$, and $R^4$ are the same as or different from each other and each represent a hydrocarbon group having 1 to 16 carbon atoms; and X represents an anionic residue of a carboxylic acid or organic sulfonic acid.

The hydrocarbon group having 1 to 16 carbon atoms is exemplified by straight or branched chain alkyl groups such as methyl, ethyl, propyl, isopropyl, butyl, isobutyl, s-butyl, t-butyl, pentyl, hexyl, octyl, decyl, and dodecyl groups; straight or branched chain alkenyl groups such as vinyl, allyl, and crotyl groups; aryl groups such as phenyl, toluoyl, xylyl, naphthyl, anthryl, and phenanthryl groups; and aralkyl groups such as benzyl and phenethyl groups. Among them, straight or branched chain alkyl groups having 1 to 6 carbon atoms are preferred, of which butyl group is more preferred.

The "carboxylic acid" in the "anionic residue of a carboxylic acid or organic sulfonic acid" is exemplified by aliphatic monocarboxylic acids having 1 to 20 carbon atoms, such as octanoic acid, decanoic acid, lauric acid, myristic acid, and palmitic acid; and alicyclic carboxylic acids (e.g., monocyclic alicyclic mono- or poly-carboxylic acids and bridged mono- or poly-carboxylic acids), such as 1,2,4,5-cyclohexanetetracarboxylic acid, bicyclo[2.2.1]heptane-2,3-dicarboxylic acid, and methylbicyclo[2.2.1]heptane-2,3-dicarboxylic acid. An alicycle constituting such alicyclic carboxylic acid may have one or more substituents bonded thereto. The substituents are exemplified by linear or branched chain alkyl groups having 1 to 4 carbon atoms, such as methyl group; alkoxy groups having 1 to 4 carbon atoms, such as methoxy group; and halogen atoms such as chlorine atoms. Among them, the carboxylic acid is preferably an aliphatic monocarboxylic acid having 10 to 18 carbon atoms or an alicyclic polycarboxylic acid having 8 to 18 carbon atoms.

The "organic sulfonic acid" in the "anionic residue of a carboxylic acid or organic sulfonic acid" is exemplified by aliphatic sulfonic acids (including aliphatic sulfonic acids having 1 to 16 carbon atoms), such as methanesulfonic acid, ethanesulfonic acid, 1-propanesulfonic acid, 2-propanesulfonic acid, 1-butanesulfonic acid, 1-pentanesulfonic acid, 1-hexanesulfonic acid, 1-octanesulfonic acid, 1-decanesulfonic acid, and 1-dodecanesulfonic acid; as well as benzenesulfonic acid, p-toluenesulfonic acid, 4-ethylbenzenesulfonic acid, 3-(linear or branched chain octyl)benzenesulfonic acid, 4-(linear or branched chain octyl)benzenesulfonic acid, 3-(linear or branched chain dodecyl)benzenesulfonic acid, 4-(linear or branched chain dodecyl)benzenesulfonic acid, 2,4-dimethylbenzenesulfonic acid, 2,5-dimethylbenzenesulfonic acid, 4-methoxybenzenesulfonic acid, 4-ethoxybenzenesulfonic acid, and 4-chlorobenzenesulfonic acid.

The quaternary phosphonium salts are represented by tetrabutylphosphonium decanoate, tetrabutylphosphonium laurate, tetrabutylphosphonium myristate, tetrabutylphosphonium palmitate, a salt of tetrabutylphosphonium cation with bicyclo[2.2.1]heptane-2,3-dicarboxylic acid and/or methylbicyclo[2.2.1]heptane-2,3-dicarboxylic acid anion, a salt of tetrabutylphosphonium cation with 1,2,4,5-cyclohexanetetracarboxylic acid anion, a salt of tetrabutylphosphonium cation with methanesulfonic acid anion, a salt of tetrabutylphosphonium cation with benzenesulfonic acid anion, a salt of tetrabutylphosphonium cation with p-toluenesulfonic acid anion, a salt of tetrabutylphosphonium cation with 4-chlorobenzenesulfonic acid anion, and a salt of tetrabutylphosphonium cation with dodecylbenzenesulfonic acid anion.

The organometallic salts are exemplified by tin octylate, zinc octylate, dibutyltin dilaurate, and aluminum complex of acetylacetone.

The boron compounds are exemplified by boron trifluoride and triphenyl borate.

The curing accelerator (E) may also be available as commercial products typically under the trade names "U-CAT SA-506," "U-CAT SA-102," and "U-CAT 5003" (each from San-Apro Ltd.).

The epoxy resin composition may include the curing accelerator(s) (E) in an amount not critical, but preferably 0.05 to 5 parts by weight, more preferably 0.1 to 3 parts by weight, furthermore preferably 0.2 to 3 parts by weight, and particularly preferably 0.25 to 2.5 parts by weight, per 100 parts by weight of the curing agent (D). The curing accelerator(s) (E), if contained in an amount of less than 0.05 part by weight, may not sufficiently effectively accelerate the curing. In contrast, the curing accelerator(s) (E), if contained in an amount of more than 5 parts by weight, may cause the cured product to have an inferior hue. The curing accelerator (E) is a compound that functionally accelerates a curing reaction upon curing of an epoxy compound with an acid anhydride.

[Curing Catalyst (F)]

The curing catalyst (F) is a cationic-polymerization initiator (cationic catalyst). The cationic-polymerization initiator is an initiator that releases a substance initiating cationic polymerization upon the application of heat or light.

Of curing catalysts (F), exemplary cationic-polymerization initiators that generate a cationic species upon the application of heat include aryldiazonium salts, aryliodonium salts, arylsulfonium salts, and allene-ion complexes. Among them, preferably usable are commercial products typically as PP-33, CP-66, and CP-77 (from ADEKA CORPORATION); FC-509 (from 3M Company); UVE 1014 (from General Electric Company); San-Aid SI-60L, San-Aid SI-80L, San-Aid SI-100L, and San-Aid SI-110L (from Sanshin Chemical Industry Co., Ltd.); and CG-24-61 (from Ciba Japan K.K.). Such curing catalysts usable herein further include a compound of a silanol (e.g., triphenylsilanol) with a chelate compound between a metal (e.g., aluminum or titanium) and acetoacetic acid or a diketone; or a compound of a phenol (e.g., bisphenol-S) with a chelate compound between a metal (e.g., aluminum or titanium) and acetoacetic acid or a diketone.

Of curing catalysts (F), exemplary cationic-polymerization initiators that generate a cationic species upon the application of an ultraviolet ray include hexafluoroantimonate salts, pentafluorohydroxyantimonate salts, hexafluorophosphate salts, and hexafluoroarsenate salts. Among them, preferably usable are commercial products available typically under the trade name "CPI-100P" (from San-Apro Ltd.), the trade names "CD-1010," "CD-1011," and "CD-1012" (each from Sartomer Company Inc., U.S.A.); the trade name "IRGACURE 264" (from Ciba Japan K.K.); and the trade name "CIT-1682" (from Nippon Soda Co., Ltd.).

The curing catalyst (F), when used, helps the liquid curable epoxy resin composition according to the present invention to give a resin composition through cationic curing by the action of heat or light.

The epoxy resin composition may contain the curing catalyst(s) (F) in an amount not critical, but preferably 0.01 to 15 parts by weight, more preferably 0.05 to 12 parts by weight, and furthermore preferably 0.1 to 10 parts by weight, per 100 parts by weight of the component (A). The epoxy resin composition, when containing the curing catalyst(s) (F) in an amount within this range, can give a cured product having satisfactory properties such as thermal stability, transparency, and weatherability.

[Additives]

The liquid curable epoxy resin composition according to the present invention may include, where necessary, a polyester polyol and/or a polycarbonate polyol each having two or more terminal hydroxyl groups per molecule. The epoxy resin composition, when including the polyester polyol and/or polycarbonate polyol, can give a resin cured product having better heat-cycle endurance while maintaining thermal stability. The hydroxyl groups may each be an alcoholic hydroxyl group or a phenolic hydroxyl group. The polyester polyol or polycarbonate polyol is not limited, as long as capable of forming a liquid curable epoxy resin composition after being blended with other components such as the component (A). However, the polyester polyol or polycarbonate polyol is preferably liquid by itself. The polyester polyol or polycarbonate polyol may have a number-average molecular weight of preferably 200 to 10000, more preferably 300 to 5000, and furthermore preferably 400 to 4000. The polyester polyol or polycarbonate polyol, if having a molecular weight of less than 200, may not satisfactorily effectively help the cured product to have a lower elastic modulus and a higher flexural strength (bending strength); and, if having a molecular weight of more than 10000, may become not liquid at room temperature (25° C.). The epoxy resin composition may include the polyester polyol and/or polycarbonate polyol in an amount of preferably 5 to 50 parts by weight, more preferably 10 to 45 parts by weight, and furthermore preferably 20 to 40 parts by weight, per 100 parts by weight of the component (A). The epoxy resin composition, if containing the polyester polyol and/or polycarbonate polyol in an amount of more than 50 parts by weight, may give a cured product having lower thermal stability and/or lower transparency although having better flexural strength. In contrast, the epoxy resin composition, if containing the polyester polyol and/or polycarbonate polyol in an amount of less than 5 parts by weight, may fail to enjoy sufficient effects of the polyester polyol and/or polycarbonate polyol as added.

The polyester polyol and/or polycarbonate polyol may include any of straight chain polyols and branched chain polyols, may include two or more different straight or branched chain polyols, or may include both a straight chain polyol and a branched chain polyol.

The polyester polyol has at least one ester skeleton per molecule and may be synthetically prepared by a procedure for the preparation of regular polyester polyols, such as transesterification or ring-opening polymerization of a lactone. A polyol for use in the synthesis of the polyester polyol is exemplified by ethylene glycol, diethylene glycol, 1,3-propanediol, 1,4-butanediol, 1,3-butanediol, 2,3-butanediol, 1,5-pentanediol, 3-methyl-1,5-pentanediol, 1,6-hexanediol, 2,6-hexanediol, 1,4-cyclohexanedimethanol, 1,12-dodecanediol, polybutadienediols, neopentyl glycol, tetramethylene glycol, propylene glycol, dipropylene glycol, glycerol, trimethylolpropane, 1,3-dihydroxyacetone, hexylene glycol, 1,2,6-hexanetriol, ditrimethylolpropane, and pentaerythritol. A carboxylic acid for use in the synthesis of the polyester polyol is exemplified by oxalic acid, adipic acid, sebacic acid, fumaric acid, malonic acid, succinic acid, glutaric acid, azelaic acid, citric acid, 2,6-naphthalenedicarboxylic acid, phthalic acid, isophthalic acid, terephthalic acid, citraconic acid, 1,10-decanedicarboxylic acid, methylhexahydrophthalic anhydride, hexahydrophthalic anhydride, methyltetrahydrophthalic anhydride, tetrahydrophthalic anhydride, pyromellitic anhydride, trimellitic anhydride, lactic acid, malic acid, glycolic acid, dimethylolpropionic acid, and dimethylolbutanoic acid. The lactone for use in the lactone ring-opening polymerization is exemplified by ε-caprolactone, δ-valerolactone, and γ-butyrolactone.

Exemplary commercial products as the polyester polyol include those available under the trade names PLACCEL 205U, L205AL, L208AL, L212AL, L220AL, L230AL, 220ED, 220EC, 220EB, 303, 305, 308, 312, L312AL, 320, L320AL, 410, 410D, P3403, E227, DC2009, DC2016, and DC2209 (each from Daicel Chemical Industries Ltd.).

The polycarbonate polyol has a carbonate skeleton and may be synthetically prepared by a procedure for the preparation of regular polycarbonate polyols, such as a phosgene process or a carbonate interchange reaction using a dialkyl carbonate (e.g., dimethyl carbonate or diethyl carbonate) or diphenyl carbonate (e.g., JP-A No. S62-187725, JP-A No. H02-175721, JP-A No. H02-49025, JP-A No. H03-220233, and JP-A No. H03-252420). A resin cured product derived from a composition including such a polycarbonate polyol is highly stable even under hot and humid conditions because of having polycarbonate bonds resistant to thermal decomposition.

A polyol for use in combination with the dialkyl carbonate in the carbonate interchange reaction is exemplified by 1,6-hexanediol, ethylene glycol, diethylene glycol, 1,3-propanediol, 1,4-butanediol, 1,3-butanediol, 2,3-butanediol, 1,5-pentanediol, 3-methyl-1,5-pentanediol, 1,4-cyclohexanedimethanol, 1,12-dodecanediol, butadienediol, neopentyl glycol, tetramethylene glycol, propylene glycol, and dipropylene glycol.

The polycarbonate polyol may have a number-average molecular weight not critical, but preferably 200 to 10000, more preferably 300 to 5000, and furthermore preferably 400 to 4000. The polycarbonate polyol, if having a number-average molecular weight of less than 200, may not sufficiently effectively help the epoxy resin composition to give a cured product having a lower elastic modulus and a higher flexural strength; and, if having a number-average molecular weight of more than 10000, may cause the epoxy resin composition to be not liquid at room temperature (25° C.)

The polycarbonate polyol is also available as commercial products such as PLACCEL CD 205, CD 210, CD 220, CD 205PL, CD 205HL, CD 210PL, CD 210HL, CD 220PL, CD 220HL, CD 220EC, and CD 221T (each from Daicel Chemical Industries Ltd.); ETERNACOLL UH-CARB50, UH-CARB100, UH-CARB300, UH-CARB90 (1/3), UH-CARB90 (1/1), and UH-CARB100 (each from Ube Industries, Ltd.); and DURANOL T6002, T5652, T4672, T4692, and G3452 (each from Asahi Kasei Chemicals Corporation).

The epoxy resin composition may include the polycarbonate polyol in an amount not critical, but preferably 5 to 50 parts by weight, more preferably 10 to 45 parts by weight, and furthermore preferably 20 to 40 parts by weight, per 100 parts by weight of the component (A). The epoxy resin composition, if including the polycarbonate polyol in an amount of more than 50 parts by weight, may give a cured product having lower transparency although having a higher flexural strength. In contrast, the epoxy resin composition, if including the polycarbonate polyol in an amount of less than 5 parts by weight, may fail to enjoy sufficient effects of the polycarbonate polyol as added.

The liquid curable epoxy resin composition according to the present invention may include a hydroxyl-containing low-molecular-weight compound according to necessity. The hydroxyl-containing low-molecular-weight compound, when present in the composition, allows the curing reaction to proceed gently. The hydroxyl-containing low-molecular-weight compound is exemplified by ethylene glycol, diethylene glycol, and glycerol. The hydroxyl-containing low-molecular-weight compound is a low molecular weight substance and is distinguished from the polyester polyols and polycarbonate polyols.

In addition, the liquid curable epoxy resin composition according to the present invention may include any of various additives within ranges not adversely affecting properties such as viscosity and electric properties. Such additives are exemplified by silicone- or fluorine-containing antifoaming agents; silane coupling agents such as γ-glycidoxypropyltrimethoxysilane; fillers; antioxidants; flame retardants; and colorants. These additives may be contained in an amount of preferably, but not limitatively, 5% or less in weight percent based on the total weight of the resin composition.

The liquid curable epoxy resin composition according to the present invention has a low viscosity, gives a resin cured product having a high glass transition temperature and a low water absorption percentage, and is preferably usable typically for encapsulation of semiconductors, for encapsulation typically of optical semiconductors, for bonding of electronic components, as sealers, for coil casting, and as substrate materials. Above all, the liquid curable epoxy resin composition is particularly preferably used as a resin composition for semiconductor encapsulation (semiconductor-encapsulating resin composition).

The liquid curable epoxy resin composition according to the present invention may be cured by any procedure not critical, such as the application of heat and/or light (active energy ray) such as an ultraviolet ray, to give a resin cured product.

[Resin Cured Article]

A resin cured product according to an embodiment of the present invention is obtained by curing the liquid curable epoxy resin composition according to the present invention. The resin cured product according to the present invention includes at least a silica (B); and a moiety (unit) derived from a cycloaliphatic epoxy compound (A) having at least one alicyclic skeleton and two or more epoxy groups per molecule.

[Semiconductor Device]

A semiconductor device according to an embodiment of the present invention includes a semiconductor element encapsulated with the liquid curable epoxy resin composition for semiconductor encapsulation according to the present invention.

The liquid curable epoxy resin composition according to the present invention may be obtained by blending a base resin (a mixture of the components (A), (B), and (C)), a curing agent, a curing accelerator, and other optional components or by blending the base resin with a curing catalyst and other optional components. The base resin by itself is usable as a liquid curable epoxy resin composition according to the present invention. In this case, the liquid curable epoxy resin composition according to the present invention is preferably used as or in a thermally curable resin composition or photo-curable (active-energy-ray-curable) resin composition.

The liquid curable epoxy resin composition according to the present invention can be prepared by a known process. Typically, the epoxy resin composition may be prepared by blending a base resin including the components (A), (B), and (C) with optional additives (e.g., the component (F) or a combination of the component (D) with the component (E)) in predetermined amounts; and stirring and mixing them preferably with degassing (debubbling) and heating in a vacuum. The mixing/stirring is generally preferably performed at a preset temperature of 10° C. to 150° C. An epoxy resin composition, if prepared at a preset temperature of lower than 10° C., may disadvantageously have a too high viscosity to be stirred and mixed homogeneously. In contrast, an epoxy resin composition, if prepared at a preset temperature of higher than 150° C., may disadvantageously undergo a curing reaction to fail to give a normal liquid curable epoxy resin composition. The epoxy resin composition may be prepared by mixing and stirring components using a general-purpose apparatus such as a single-screw or multi-screw extruder equipped with a decompression device; a kneader; or a dissolver, for a duration typically of about 10 minutes.

The prepared liquid curable epoxy resin composition is poured into a predetermined forming die, cured (thermally cured or photo-cured) under predetermined conditions to perform, for example, semiconductor encapsulation. Typically, when the liquid curable epoxy resin composition according to the present invention is subjected to thermal curing (thermal curing with an acid anhydride; cationic curing), the curing may be performed at a temperature (curing temperature) of preferably, but not limitatively, 100° C. to 200° C., more preferably 100° C. to 190° C., and furthermore preferably 100° C. to 180° C. for a time (curing time) of typically preferably 30 to 600 minutes, more preferably 45 to 540 minutes, and furthermore preferably 60 to 480 minutes. The resin composition, if cured at a temperature for a time lower (shorter) than the lower limits of the above-specified ranges, may be disadvantageously insufficiently cured. In contrast, the resin composition, if cured at a temperature for a time higher (longer) than the upper limits of the above-specified ranges, may disadvantageously suffer from decomposition of resin components. While depending on various factors, the curing conditions can be suitably adjusted typically so that the curing time is shortened at a high curing temperature; and the curing time is extended at a low curing temperature. Curing may also be performed in two or more steps.

When the liquid curable epoxy resin composition according to the present invention is subjected to photocuring (photo-induced cationic curing), the active energy ray (light) used for curing is exemplified by, but not limited to, ultraviolet rays and electron beams, of which an ultraviolet ray is preferably usable. The ultraviolet ray may have a wavelength suitably choosable according typically to the type of the curing catalyst. The active energy ray may be applied under conditions which are not critical and suitably choosable according typically to the type of the epoxy resin composition, the thickness of a resulting cured product, as well as the type and amount of the curing catalyst. An ultraviolet ray, when used as the active energy ray, may be applied at an irradiance level (dose) of preferably 10 to 10,000 $mJ/cm^2$ and more preferably 50 to 5,000 $mJ/cm^2$. An irradiation source for the ultraviolet ray is exemplified by high-pressure mercury lamps, ultra-high-pressure mercury lamps, xenon lamps, carbon arc, metal halide lamps, sunlight, and LED lamps.

The liquid curable epoxy resin composition according to the present invention, when photocured by the application of an active energy ray, may be heated according to necessity after the photocuring. The heating helps the resin cured product to contain less amounts of unreacted components, to have a higher degree of curing, and to have less strain (to have relieved strain). The heating may also help the resin cured product to have a higher hardness and/or better adhesion. The heating can generally be performed under conditions at an ambient temperature of 100° C. to 200° C. for a duration of 1 to 300 minutes.

EXAMPLES

The present invention will be illustrated in further detail with reference to several examples below, which are by no means intended to limit the scope of the invention. Properties of liquid curable epoxy resin compositions according to examples were measured by methods as follows.
[Viscosity Stability]
A sample liquid curable epoxy resin composition was stirred at 120° C. for one hour, and viscosities of the composition before and after the heating (heating with stirring) were measured. The viscosities were measured at 25° C. using an E-type viscometer ["TVE-22H" supplied by Toki Sangyo Co., Ltd.].

Example 1

As a base resin, there were used a 100 parts by weight of a resin composition (the trade name "NANOPDX E600" supplied by nanoresins AG (Evonik Nanoresins)); and 0.5 part by weight of bis(2,6-di-t-butyl-4-methylphenyl)pentaerythritol diphosphite (the trade name "ADK STAB PEP-36" supplied by ADEKA CORPORATION) as a component (C). The resin composition included 60 parts by weight of 3,4-epoxycyclohexylmethyl 3',4'-epoxycyclohexanecarboxylate as a component (A); and 40 parts by weight of a silica as a component (B).
These were blended through stirring/mixing using a "AWATORIRENTARO (Thinky Mixer)" supplied by THINKY CORPORATION at room temperature for 20 minutes and yielded a liquid curable epoxy resin composition.
The resulting liquid curable epoxy resin composition was examined on viscosity stability and was found to have a viscosity of 2,940 mPa·s after heating with stirring while having a viscosity of 2,360 mPa·s before heating with stirring (after blending of the base resin).

Example 2

As a base resin, there were used 60 parts by weight of 3,4-epoxycyclohexylmethyl 3',4'-epoxycyclohexanecarboxylate (the trade name "CELLOXIDE 2021P" supplied by Daicel Chemical Industries Ltd.) as a component (A); 40 parts by weight of a fused silica (the trade name "FUSELEX RD-8" supplied by Tatsumori Ltd.) as a component (B); and 0.5 part by weight of bis(2,6-di-t-butyl-4-methylphenyl)pentaerythritol diphosphite (the trade name "ADK STAB PEP-36" supplied by ADEKA CORPORATION) as a component (C).
These were blended by mixing/stirring at 80° C. for 90 minutes and yielded a liquid curable epoxy resin composition.
The resulting liquid curable epoxy resin composition was examined on viscosity stability and was found to have a viscosity of 900 mPa·s after heating with stirring while having a viscosity of 870 mPa·s after blending of the base resin.

Comparative Example 1

A resin composition used herein was a resin composition (the trade name "NANOPDX E600" supplied by nanoresins AG (Evonik Nanoresins)) including 60 parts by weight of 3,4-epoxycyclohexylmethyl 3',4'-epoxycyclohexanecarboxylate as a component (A); and 40 parts by weight of a silica as a component (B). The resin composition was examined on viscosity stability and was found to have a viscosity of 3,380 mPa·s after heating with stirring while having a viscosity of 2,360 mPa·s before heating with stirring.

Comparative Example 2

A liquid curable epoxy resin composition was prepared by the procedure of Example 2, except for not using bis(2,6-di-t-butyl-4-methylphenyl)pentaerythritol diphosphite (the trade name "ADK STAB PEP-36" supplied by ADEKA CORPORATION) as the component (C).
The resulting liquid curable epoxy resin composition was examined on viscosity stability and was found to have a viscosity of 5,700 mPa·s after heating with stirring while having a viscosity of 2,000 mPa·s after blending of the base resin.
As is demonstrated above, the liquid curable epoxy resin compositions employing the components (A), (B), and (C) (Examples) had satisfactory viscosity stability and could be stored satisfactorily stably (had long shelf lives). In contrast, the resin compositions using no component (C) (Comparative Examples) had poor viscosity stability and failed to be stored stably.

INDUSTRIAL APPLICABILITY

Liquid curable epoxy resin compositions according to embodiments of the present invention are silica-containing epoxy resin compositions, have low viscosities, and can be stored satisfactorily stably (have long shelf lives). The liquid curable epoxy resin compositions according to the present invention contains a silica, and thereby give, through curing, resin cured products which have low coefficients of thermal expansion and are usable particularly preferably as resin compositions for semiconductor encapsulation.

The invention claimed is:
1. A liquid curable epoxy resin composition comprising a cycloaliphatic epoxy compound (A); a silica (B); and a phosphite ester (C), the cycloaliphatic epoxy compound (A) having at least one alicyclic skeleton and two or more epoxy groups per molecule;
wherein the phosphite ester (C) is at least one selected from the group consisting of bis(2,6-di-t-butyl-4-methylphenyl)pentaerythritol diphosphite, bis(2,4-di-t-butylphenyl)pentaerythritol diphosphite, tris(2-ethylhexyl)phosphite, and trisisodecyl phosphite.
2. The liquid curable epoxy resin composition of claim 1, comprising:
5 to 80 parts by weight of the cycloaliphatic epoxy compound (A) having at least one alicyclic skeleton and two or more epoxy groups per molecule;
20 to 95 parts by weight of the silica (B); and
0.001 to 5.0 parts by weight of the phosphite ester (C),
per 100 parts by weight of the component (A) and the component (B).

3. The liquid curable epoxy resin composition of claim 1, further comprising a curing catalyst (F), or a combination of a curing agent (D) with a curing accelerator (E).

4. The liquid curable epoxy resin composition of claim 1, as a semiconductor-encapsulating liquid curable epoxy resin composition.

5. A resin cured product cured from the liquid curable epoxy resin composition of claim 1.

6. A semiconductor device comprising a semiconductor element encapsulated with the semiconductor-encapsulating liquid curable epoxy resin composition of claim 4.

7. The liquid curable epoxy resin composition of claim 2, further comprising a curing catalyst (F), or a combination of a curing agent (D) with a curing accelerator (E).

8. The liquid curable epoxy resin composition of claim 2, as a semiconductor-encapsulating liquid curable epoxy resin composition.

9. The liquid curable epoxy resin composition of claim 3, as a semiconductor-encapsulating liquid curable epoxy resin composition.

10. A resin cured product cured from the liquid curable epoxy resin composition of claim 2.

11. A resin cured product cured from the liquid curable epoxy resin composition of claim 3.

12. A resin cured product cured from the liquid curable epoxy resin composition of claim 4.

13. A semiconductor device comprising a semiconductor element encapsulated with the semiconductor-encapsulating liquid curable epoxy resin composition of claim 8.

14. A semiconductor device comprising a semiconductor element encapsulated with the semiconductor-encapsulating liquid curable epoxy resin composition of claim 9.

* * * * *